(12) United States Patent
Losehand

(10) Patent No.: US 7,504,708 B2
(45) Date of Patent: Mar. 17, 2009

(54) HIGH-FREQUENCY SWITCHING DEVICE

(75) Inventor: Reinhard Losehand, Munich (DE)

(73) Assignee: Infineon Technologies AG, Munich (DE)

( * ) Notice: Subject to any disclaimer, the term of this patent is extended or adjusted under 35 U.S.C. 154(b) by 165 days.

(21) Appl. No.: 11/541,426

(22) Filed: Sep. 29, 2006

(65) Prior Publication Data

US 2007/0085168 A1 Apr. 19, 2007

(30) Foreign Application Priority Data

Sep. 30, 2005 (DE) .................. 10 2005 047 001.7

(51) Int. Cl.
*H01L 27/102* (2006.01)
*H01L 29/70* (2006.01)
*H01L 31/11* (2006.01)

(52) U.S. Cl. .................. 257/565; 257/197; 257/552

(58) Field of Classification Search ......... 257/197–198, 257/552, 565–576
See application file for complete search history.

(56) References Cited

U.S. PATENT DOCUMENTS 6,750,526 B2 * 6/2004 Nakashima ............. 257/520

7,397,128 B2 * 7/2008 Kubo et al. ............. 257/774
2005/0167784 A1 * 8/2005 Losehand ............. 257/552

FOREIGN PATENT DOCUMENTS

EP 1 542 287 A1 6/2005

* cited by examiner

*Primary Examiner*—Cuong Q Nguyen
(74) *Attorney, Agent, or Firm*—Maginot, Moore & Beck

(57) ABSTRACT

A high-frequency switching device comprises a connecting region having a first conductivity type, and a first barrier region bordering on the connecting region and having a second conductivity type. A semiconductor region border on the first barrier region and has a dopant concentration which is lower than a dopant concentration of the first barrier region or equal to zero. A second barrier region borders on the first semiconductor region and has the first conductivity type. A base region borders on the second barrier region and has the second conductivity type. A third barrier region borders on the semiconductor region and has the second conductivity type and a higher dopant concentration than the semiconductor region. An emitter region borders on the third barrier region and has the first conductivity type. A fourth barrier region borders on the semiconductor region and has the second conductivity type and a higher dopant concentration than the semiconductor region. A collector region borders on the fourth barrier region and has the first conductivity type.

6 Claims, 3 Drawing Sheets

HIGH-FREQUENCY SWITCHING DEVICE

CROSS-REFERENCE TO RELATED APPLICATIONS

This application claims priority from German Patent Application No. 102005047001.7, which was filed on Sep. 30, 2005 and is incorporated herein by reference in its entirety.

FIELD

The present invention relates generally to a high-frequency device and particularly a high-frequency device with differently doped semiconductor regions.

BACKGROUND

High-frequency switches have the function to pass or block high-frequency signals. In the passing case, they should be characterized by an ohmic resistor, which is as small as possible, and in the blocking case, by a constant capacitance, which is as small as possible. They can be realized by different types of switching elements. In integrated circuit technology, high-frequency switches are frequently realized by using a silicon substrate. Thereby, generally, the two types of bipolar or MOS transistor can be formed. In the case of a silicon bipolar transistor, the passing case is easy to realize, when the same is operated with sufficiently high emitter base current in the triode region of the characteristic curve far below the collector current saturation. With correct transistor dimensioning, this control current can remain smaller than 1 mA. The blocking case causes more difficulties, since here a base or bias voltage, which is as high as the high-frequency amplitude to be blocked, is required in the off-state. In other words, it can be said that a base emitter bias voltage has to be applied in reverse direction with an amount of at least the amplitude of the high-frequency signal, so that the collector base diode is not polarized (controlled) in flow direction. Thereby, the available bias voltage limits the switchable power. This causes the problem, for example in battery-operated mobile radio systems, that a required bias voltage of about 20 Volt is substantially higher than an operating voltage of the mobile radio system of, for example, 2.8 Volt.

High-frequency switches for higher powers are realized outside the RF-ICs (RC-IC=radio frequency integrated circuit) in the form of pin diodes or GaAs transistor switches, which can be operated with low or without bias voltage, respectively. However, disadvantages are the higher costs incurred by the additional devices. A further disadvantage of pin diodes as high-frequency switches is that pin diodes require a partly high switching time, which makes their usage problematic in high or ultrahigh frequency technique, respectively.

EP 1542287A1 discloses a high-frequency switching transistor 100, as is illustrated in FIG. 3. The high-frequency switching transistor 100 comprises a collector region 104, which has a first conductivity type, a first barrier region 108 bordering on the collector region 104, which has a second conductivity type, which differs from the first conductivity type, and a semiconductor region 114 bordering on the first barrier region 108, which has a dopant concentration, which is lower than the dopant concentration of the first barrier region 108. Further, the high-frequency switching transistor 100 has a second barrier region 120 bordering on the semiconductor region 114, which has the first conductivity type, as well as base region 112 bordering on the second barrier region 120, which has the second conductivity type. Additionally, the high-frequency switching transistor 100 comprises a third barrier region 128 bordering on the semiconductor region 114, which has the second conductivity type and a higher dopant concentration than the semiconductor region 114. Further, the high-frequency switching transistor 100 has an emitter region 130 bordering on the third barrier region 128, which has the first conductivity type.

By such a high-frequency switching transistor, it is possible to switch high-frequency signals of high amplitude with low distortion. The distortion can thereby be described by the generation of harmonics at sinusoidal control. The even harmonics (H2, H4, etc.), particularly the vibration H2 are thereby caused mainly by asymmetries in the vertical doping profile of the high-frequency switching transistor 100. The NPIPN doping profile of the high-frequency switching transistor illustrated in EP 1542287A1 cannot be realized fully symmetrically in production, so that the generation of the higher H2 vibration can become a problem.

Such a problem of generating higher harmonics can be compensated by two different approaches.

First, a series connection of two switches in opposite polarity can be used. However, this increases the switching effort significantly, because both the transistors and the bias coupling-in switching elements (e.g. resistors or coils) have to be doubled.

As a second method of reducing H2 wave generation, a longer I zone (i.e. a thick semiconductor region 114) can be used. Hereby, the space requirements are also increased, because the emitter area has to be increased in proportion to the I zone length.

SUMMARY

It would be advantageous to provide a high-frequency device, which allows reduced harmonics generation during operation compared with a conventional high-frequency device.

In accordance with a first aspect, at least one embodiment of the present invention provides a high-frequency switching device, having: a connecting region having a first conductivity type; a first barrier region bordering on the connecting region, which has a second conductivity type, which differs from the first conductivity type; a semiconductor region bordering on the first barrier region, which has a dopant concentration, which is lower than a dopant concentration of the first barrier region or equal to 0; a second barrier region bordering on the semiconductor region, which has the first conductivity type; a base region bordering on the second barrier region, which has the second conductivity type; a third barrier region bordering on the semiconductor region, which has the second conductivity type and a higher dopant concentration than the semiconductor region; an emitter region bordering on the third barrier region, which has a first conductivity type; a fourth barrier region bordering on the semiconductor region, which has the second conductivity type and a higher dopant concentration than the semiconductor region; and a collector region bordering on the fourth barrier region, which has the first conductivity type.

In accordance with a second aspect, at least one embodiment of the present invention provides a high-frequency switching device, having: a connecting region, which has a first conductivity type; a first barrier region bordering on the connecting region, which has a second conductivity type, which differs from the first conductivity type; a semiconductor region bordering on the first barrier region, which has a dopant concentration, which is lower than a dopant concentration of the first barrier region or equal to 0; a base region bordering on the semiconductor region, which has the second conductivity type; a third barrier region bordering on the semiconductor region, which has the second conductivity type and a higher dopant concentration than the semiconductor region; an emitter region bordering on the third barrier region, which has a first conductivity type; a fourth barrier region bordering on the semiconductor region, which has the second conductivity type and a higher dopant concentration than the semiconductor region; and a collector region bordering on the fourth barrier region, which has the first conductivity type, wherein the third barrier region is disposed between the base region and the fourth barrier region.

In accordance with a third aspect, at least one embodiment of the present invention provides a high-frequency circuit, having a switch with a high-frequency switching device and a control circuit which is formed to open and close the switch in dependence on a control signal, wherein the controller is formed to apply a negative switching voltage between the base region and the emitter region for closing the switch.

Advantageous features are realized according to the present invention based at least in part on the knowledge that a series connection of two adjacent bipolar transistors is charge-coupled, such that the base of the one transistor can also switch on and off the collector emitter current of the second transistor. By such an interconnection of two transistors "towards the outside", an overall transistor or an overall high-frequency device can be provided. In such an overall high-frequency device, the emitter of the second transistor can be omitted.

Thus, in at least one embodiment, the present invention provides the advantage that the additional effort for the bias voltage supply of the second transistor can be omitted. Further, the buried layer contact terminal and the insulating regions between the transistors are omitted, which are required, for example, for the high-frequency switching transistor according to EP 1542287A1. Thereby, the overall space requirement of the double transistor, i.e. the inventive high-frequency device, is not significantly higher or even smaller than the one of the simple high-frequency switching transistor according to, for example, EP 1542287A1. Further, the high-frequency switching device is characterized by a lower switching-through voltage than a high-frequency device according to the prior art.

BRIEF DESCRIPTION OF THE DRAWINGS

These and other advantages and features of the present invention will become clear from the following description taken in conjunction with the accompanying drawings, in which.

DESCRIPTION

In the following description, equal or similar elements or regions, respectively, are indicated by equal or similar reference numbers, wherein a repeated description of these reference numbers is omitted.

Figure 3:
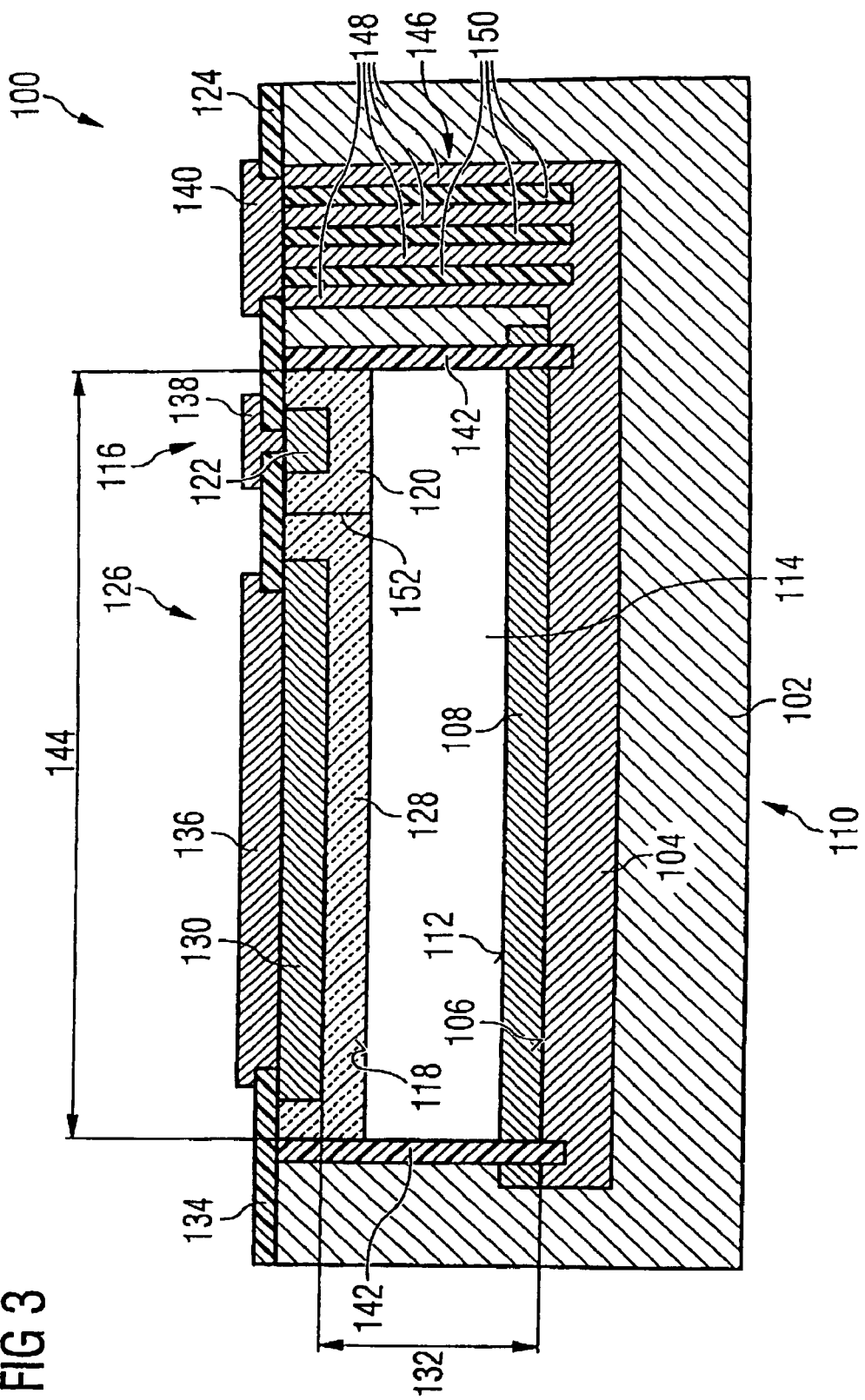
FIG. 3 is a cross-sectional representation of a high-frequency switching transistor according to the prior art.

In order to explain the mode of operation of the inventive high-frequency device, first, the high-frequency switching transistor according to FIG. 3 and its mode of operation will be discussed in more detail. FIG. 3 shows a high-frequency switching transistor 100, which comprises a semiinsulating substrate 102, in which a collector region 104 is embedded. For the understanding of the embodiment of the invention described below in detail, the collector region 104 can also be described as first device region 104. The collector region 104 has, for example, an n-doped semiconductor material with a high $N^+$ dopant concentration compared with the semiinsulating substrate 102 (i.e. the same represents a so-called buried layer n cathode). The dopant concentration of the semiconductor material in the collector region 104 comprises preferably more than $10^{19}$ dopant atoms per $cm^3$. Further, the collector region 104 forms the collector of the high-frequency transistor 100 shown in FIG. 3. Further, a first barrier region 108 is arranged on a surface 106 of the collector region 104, which preferably comprises a p-doped semiconductor material. In a middle region 110 of the high-frequency switching transistor 100, a semiconductor region 114, which preferably comprises a p-doped semiconductor material, is disposed on a surface 112 of the first barrier region 108. Thereby, the dopant concentration of the semiconductor region 114 is lower than the dopant concentration of the first barrier region 108. Preferably, the dopant concentration of the first barrier region 108 lies between $10^{16}$ and $10^{17}$ cm dopant atoms per cubic centimeter, the dopant concentration of the first barrier region 108 can, however, also be within a range of values of $10^{15}$ cm to $10^{18}$ dopant atoms per cubic centimeter. The dopant concentration of the semiconductor region, however, is preferably smaller than $10^{14}$ dopant atoms per cubic centimeter.

Further, the first barrier region 108 has preferably a thickness between the surface 106 of the collector region 104 and the surface 112 of a first barrier region 108, which lies within a range of values between 0.2 µm and 1 µm. Alternatively, the thickness of the first barrier region can also lie within a range of values between 0.1 µm and 2 µm.

Further, a second barrier region 120 is disposed in a subregion 116 of a surface 118 of the semiconductor region 114. Preferably, the second barrier region 120 comprises an n-doped semiconductor material. Further, a base region 122 is embedded in the second barrier region 120. In relation to the dopant concentration as well as the thickness of the second barrier region 120 between the surface 118 of the semiconductor region and the base region 122, the statements about the first barrier region 107 apply analogously. The base region 122 is further embedded in the second barrier region 120 such that a flush termination with the second barrier region 120 results on a surface 124.

Further, a third barrier region 126 is disposed in a subregion 126 of the surface 118 of the semiconductor region 114. Again, the third barrier region 126 comprises preferably a p-doped semiconductor material. An emitter region 130 is disposed in a third barrier region 128 such that a flush termination results between the third barrier region 128 and the emitter region 130 on the surface 124. With regard to the dopant concentration of the third barrier region 128 as well as the thickness of the third barrier region 128 between the surface 118 above the semiconductor region 114 and the emitter region 130, the statements with regard to the first barrier region 108 apply analogously.

The thickness of the semiconductor region 114 between the surface 112 of the first barrier region 108 and the surface 118 of the semiconductor region 114 is preferably within a range of values between 5 µm and 8 µm. Alternatively, the thickness of the semiconductor region 114 can also lie within a range of values between 4 µm and 10 µm. From this, a distance of 8 µm between the collector region 104 and the emitter region 130 can result.

Further, an insulating cover layer 134 is disposed on the surface 124. The insulating cover layer 134 has an opening for contacting the emitter region 130 through an emitter contact structure 136, an opening for contacting the base region 122 with the help of a base contact structure 138, as well as an opening for contacting the collector region 104 via a collector contact structure 140. Further, the high-frequency switching transistor 100 has a limiting structure 142, which limits the semiconductor region 114 as well as the third barrier region 108 on the left side, and the semiconductor region 114 as well as the second barrier region 120 on the right side. The limiting structure 142 preferably comprises an insulating material and terminates in a flush way with the second barrier region 120 and the third barrier region 128 on the surface 124. Further, the limiting structure 142 projects into the first barrier region 108 as well as the collector region 104. Thus, a lateral extension 144 of the semiconductor region 114, the second barrier region 120 as well as the third barrier region 128 is defined by the limiting structure 142. The lateral extension 144 is preferably within a range of values between 20 µm and 200 µm. The high-frequency switching transistor 100 can further be also be designed in a two-dimensional way, wherein the limiting structure defines a volume which mainly has a square base area, which is disposed in parallel to a main area of the first barrier region 108, and has a lateral base area edge, which maximally corresponds to the lateral extension 144. Further, the base area is assumed to be perpendicular to the level of the drawing of FIG. 3.

Outside the region defined by the limiting structure 104 with the lateral extension 144, further, a contacting structure 146 is disposed. The contacting structure 146 has conductive regions 148 and insulating regions 150. The conductive regions 148 of the contacting structure 146 allow further an electrically conductive connection of the collector contact region 140 to the collector region 104. Thereby, it is possible to contact the collector region 104 in a conductive way via the collector contacting region 140, wherein the collector contacting region 140 is disposed higher above the collector region 104 than, for example, a limiting area between the second barrier region 120 and the base region 122.

Further, the second barrier region 120 can be disposed in a predefined distance 152 to the third barrier region 128. In FIG. 3, the predefined distance 152 between the second barrier region 120 and the third barrier region 128 has a value of 0, the predefined distance can, however, be up to 20 µm.

Thus, FIG. 3 shows the cross section of a structure of an integratable npn bipolar transistor, which is optimized for switch applications. A buried layer (collector region 104) with a trench sinker (contacting structure 146) is used, by which the collector region 104 can be contacted from the surface 124 by using the collector contacting region 140. The high-frequency switching transistor 100 is further surrounded by the trench (limiting structure 142), which avoids coupling by minority carrier injection to possible adjacent high-frequency switching transistors (not illustrated in FIG. 3). An emitter-base-collector doping profile includes a low n (or p)-doped, almost intrinsic base I zone (semiconductor region 114). A higher p-doping is introduced directly at the emitter region 130 and the collector region 104 (first barrier region 108 as well as third barrier region 128), which form barriers against electron emission from the respectively adjacent collector region 104 as well as the emitter region 130 in the semiconductor region 114. Thereby, the blocking capability of the high-frequency switching transistor 100 is effected. A base contact is formed in the intrinsic base region (i.e. in the semiconductor region 114), whereby the second barrier region 120 as well as the base region 122 embedded in the second barrier region 120 result. The base region 122, which comprises a p-doped semiconductor material, is further surrounded by an n-doped zone, i.e. the second barrier region 120, which forms a barrier against hole emission. Thus, according to the high-frequency switching transistor illustrated in FIG. 3, an n-doped semiconductor material forms the first conductivity type, and a p-doped semiconductor material the second conductivity type. Thereby, the base region 122 obtains the characteristic that it can receive holes at negative voltage against emitter or collector, but returns them at positive polarity only when achieving a threshold voltage. This threshold voltage depends on forming a space-charge zone between the emitter region 130 and the base region 122 (or between the third barrier region 128 and the second barrier region 120, respectively) (emitter injection threshold voltage). This space-charge zone depends, among others, on the predetermined distance 152 between the second barrier region 120 and the third barrier region 128. Further, an injection threshold voltage between the base region 122 and the collector region 104 has to be considered, which is again formed by a space-charge zone between the first barrier region 108 and the second barrier region 120. Additionally, a collector emission threshold voltage has to be considered, which is caused by the formation of a space-charge zone between the first barrier region 108 and the third barrier region 128. Thus, by selecting the respective distances between the first barrier region 108, the second barrier region 120 and the third barrier region 128 (i.e. by an appropriate construction of the high-frequency switching transistor 100 illustrated in FIG. 3), it can be achieved that the emitter injection threshold voltage is small (for example 2.5 Volt), while the collector injection threshold voltage is high (for example 20 Volt). Below the respective emission threshold voltages, the switch-on process is delayed so heavily by the formation of space-charge zones in the barrier regions, that no mentionable current flows in flow direction during short-term control.

Further, the high-frequency switching transistor illustrated in FIG. 3 can be built-in in a high-frequency circuit, which is not illustrated here. The high-frequency circuit can comprise a control circuit, which is formed to open and close the switch with the high-frequency switching transistor in dependence on the control signal, wherein this control means is formed to apply a negative switching voltage between the base region and the emitter region for closing the switch. Thereby, the switch can have a switch input (for example the collector region of the high-frequency switching transistor), which can be coupled to a high-frequency source. A voltage signal can be supplied by the high-frequency source, which has a high-frequency voltage amplitude, wherein the switching voltage is smaller or equal to half the high-frequency voltage amplitude. Thus, the transistor can tolerate high-frequency voltage amplitudes of, for example, up to 20 Volt between the collector region 104 and the emitter region 130 in the blocking case, but can be switched to the on-state by the control circuit with a base-emitter voltage of more than 2.5 Volt.

In order to switch back to the off-state, the high-frequency switching transistor according to FIG. 3 requires a negative base-emitter voltage, which is so high that almost all charge carriers (for example electrons or holes) can be removed from the base region (i.e. particularly the semiconductor region 114). The base-emitter voltage depends particularly on the doping in the first barrier region 108, the second barrier region 120 as well as the third barrier region 128 and can be adjusted such that it is about 2.5 Volt. Thus, thereby, circuits (particularly a high-frequency switching transistor 100) can be realized, which can switch the high-frequency switching transistor on or off with supply voltages (switching voltages) of, for example, more than 2.5 Volt. Still, the high-frequency amplitude of a high-frequency signal to be switched can be significantly higher than the switching voltage (for example 20 Volt).

Figure 1:
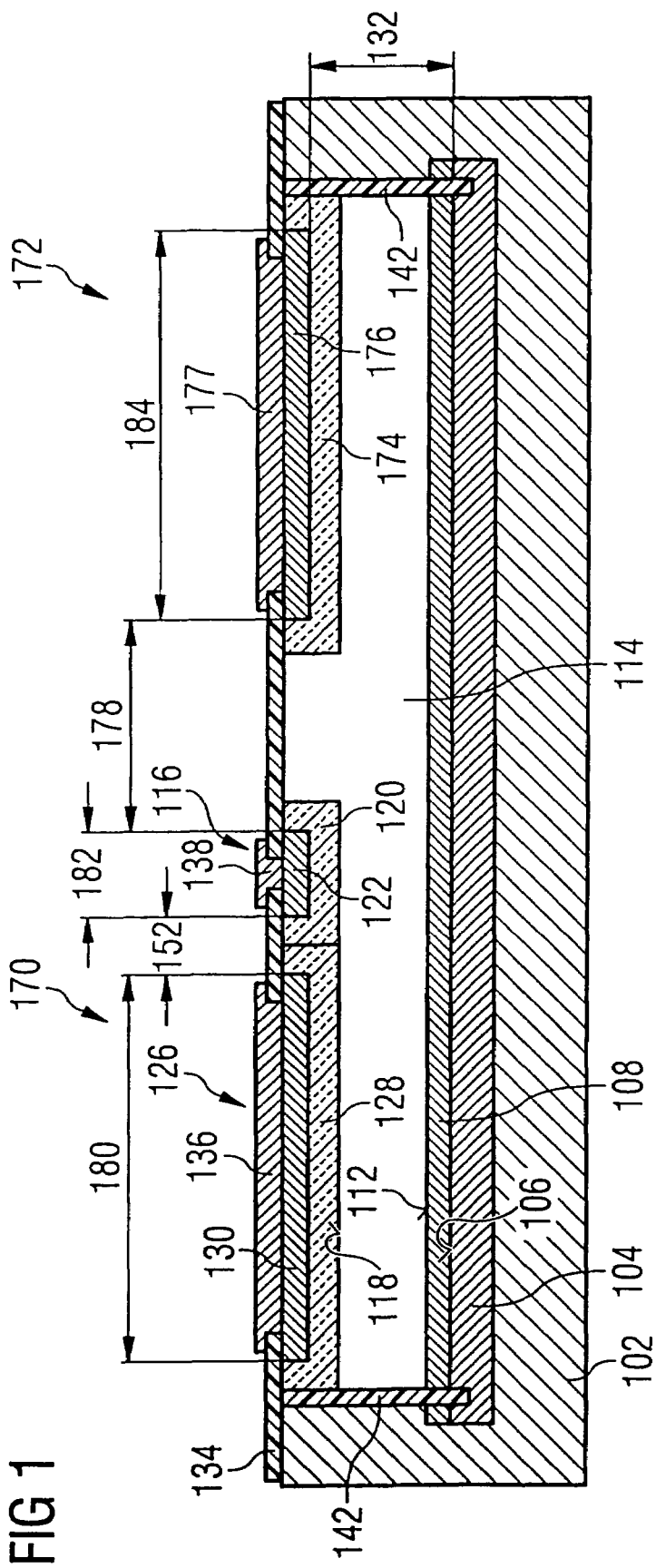
FIG. 1 is a cross-sectional representation of a first embodiment of the inventive high-frequency device.

In order to achieve an improved harmonic behavior of a high-frequency switching transistor or a high-frequency device, respectively, as described above, according to at least one embodiment of the invention, a series connection of two bipolar transistors disposed adjacent to each other is provided, which are charge-coupled to each other such that the base of the one transistor can also switch on and off the collector emitter current of the second transistor. Therefore, a high-frequency device can be provided, as it is shown in FIG. 1 in cross-sectional representation. A first transistor 170 corresponds preferably to the structure and the dimensioning regulation of the high-frequency switching transistor illustrated in FIG. 3, but without the contacting structure 146. Thereby, a second transistor 172 can preferably use the same emitter-collector doping profile, wherein, however, emitter and collector are exchanged with regard to their function. This means, for example, that the collector region 104 in the first transistor 170 is an n collector, while the collector region 104 in the region of the second transistor 172 is an n emitter, wherein the collector region 104 can generally also be referred to as device region or connecting region, since this region now marks no collector but merely a buried device layer. Analogously, the first barrier region 108 is disposed above the first device region 104 both in the region of the first transistor 170 and the second transistor 172. This means that the buried layer collector of the first transistor 170 is directly connected to the identically constructed buried layer emitter of the second transistor 172.

Further, a fourth barrier region 174 is embedded in the semiconductor region 114, which has the second conductivity type and a higher dopant concentration than the semiconductor region 114. Further, a second device region is embedded in the fourth barrier region 174, which has a first conductivity type.

Thus, a fourth barrier region 174 and a second device region 176 embedded therein have the same structural construction as the third barrier region 122 and the emitter region 130 embedded therein. This second device region 176 can be contacted by a further contacting structure 177. With regard to the exchanged function between emitter and collector in the second transistor 172 compared with the first transistor 170, it has to be said that the upper collector, i.e. the second device region 176 of the second transistor 172 functioning as n collector, can lie either next to the emitter 130 or the base 122 of the first transmitter 170. However, the same should be so far away from the base 122 or the emitter 130 of the first transistor 170, that the high-frequency amplitude is blocked in both polarities. With regard to a distance of the second device region 176, the high-frequency amplitude can be blocked in both polarities, when a first distance 132 between the first device region 104 and the emitter region 130 corresponds approximately to half of a second distance 178 between the base region 122 and the second device region 176. In other words, the second distance 178 should correspond to twice or more of the first distance 132 within a tolerance range of, for example, 10%. For example, the first distance, i.e. the vertical emitter collector distance can be 2 μm, while the second distance 178 is then approximately 4 μm. Further, the second barrier region 120 and the fourth barrier region 174 are separated from each other by a portion of the semiconductor region 114. As has already been discussed in more detail above with regard to FIG. 3, the base region 122 can also be disposed in a predetermined distance from the emitter region 130, and can have, for example, a distance of 0.3 μm. With regard to the lateral extension of the emitter region 130, i.e. the extension 180, of the base region 122 (i.e. the extension 182) as well as the lateral extension of the second device region 176 (i.e. the extension 184), it can be assumed that the emitter region 130 and the second device region 176 (i.e. the extensions 180 and 184) are approximately 10 μm, while the lateral extension of the base region 122 (i.e. the extension 122) is approximately 1 μm.

When switching on the first transistor 170, a minority carrier injection takes place, which also switches on the second transistor. When switching off, the minority carriers are again extracted by both transistors. Both transistors are surrounded by a common trench, like the limiting structure 142 illustrated in FIG. 1, which preferably comprises an insulating material, so that no minority carriers can leak out in the on-state, which decreases the coupling of the second transistor 172 to the first transistor 170 and can effect undesired couplings to, for example, further adjacent transistors.

Functionally, the two transistors 170 and 172 form together an overall transistor towards the outside, whose emitter is disposed opposite to the emitter region 130, whose base opposite to the base region 122 and whose collector opposite to the second semiconductor region 176 in a lateral direction. The high-frequency current flows through the doping profile from top to bottom and then from bottom to top in the positive half-wave on its way from emitter to collector, and vice versa with the negative half-wave. Passing the doping profile twice doubles the harmonic generation at first, but effects a compensation of asymmetries. Thus, the current draws an absolutely symmetrical doping curve, so that the even harmonics are successfully suppressed. The odd ones are doubled, which normally represents no problem, when the doping gradients of emitter and collector are large. This is the case when their doping is higher than $10^{19}$ cm$^{-3}$.

Figure 2:
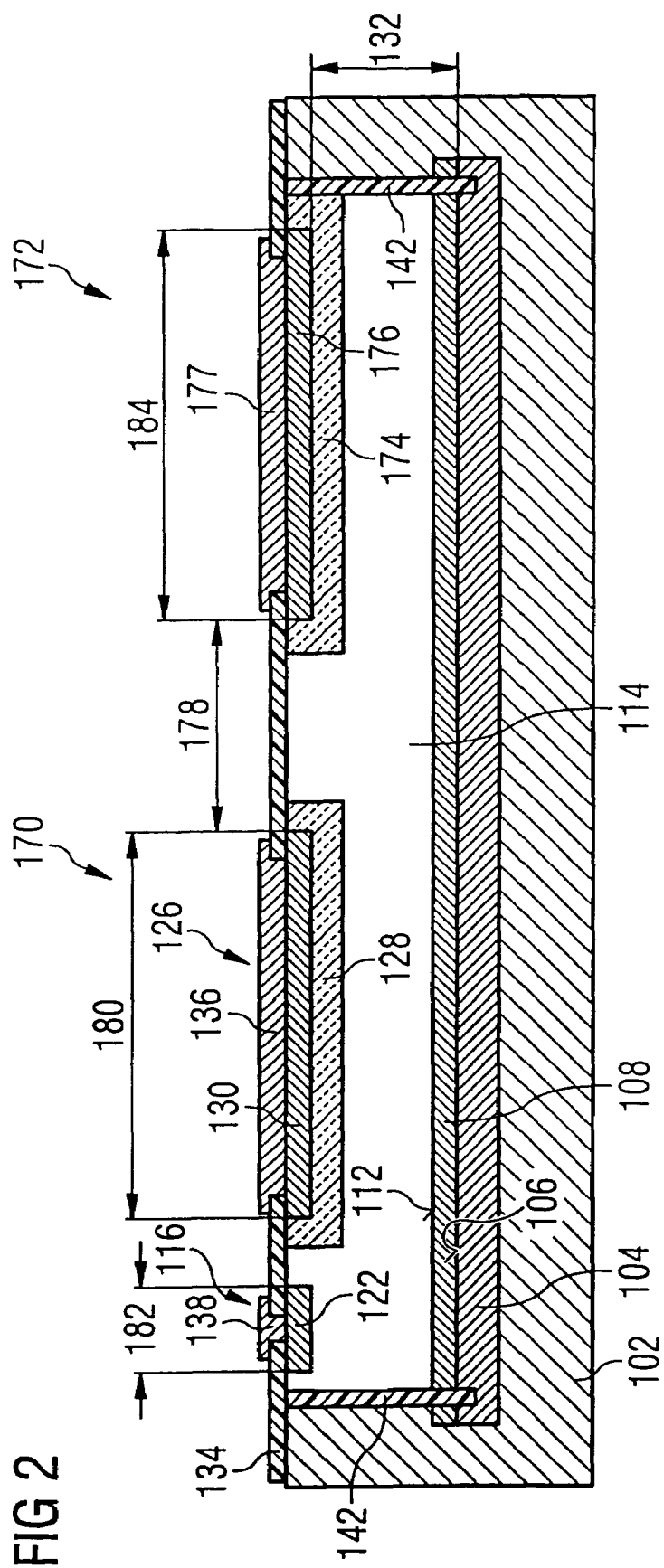
FIG. 2 is a cross-sectional representation of a second embodiment of the inventive high-frequency device.

If the layers of emitter region 130 and base region 122 are exchanged in the first transistor 170, an arrangement as illustrated in FIG. 2 results, which illustrates a cross-sectional representation of a second embodiment of the present invention. Such a position of emitter region 130 and base region 122 in the first transistor 170 has the disadvantage that the emitter base switching time becomes longer, but has the additional possibility of omitting the second base region 120 around the base region 122, as illustrated in FIGS. 1 and 3. Thus, the first transistor 170 can only be loaded with amplitudes in the height of the base bias voltage. Since the second transistor 172 in the arrangement according to FIG. 2 is shielded by the emitter 126 of the first transistor 170, it can tolerate up to twice the base bias voltage, which is normally sufficient for ultrahigh frequency circuits. Such an arrangement according to FIG. 2 offers the advantage that the dimensions can be significantly decreased and become B7HF compatible. The term B7HF indicates an Infineon bipolar transistor, which is currently used for HF-ICs, and has an $f_T$ of 70 GHz. In such a case, for example, the first distance 132 can be 0.5 μm, while the second distance 178 has a value of approximately 1 μm. At the same time, the lateral extension of the emitter region 130 (i.e. the extension 180), of the base region 122 (i.e. the lateral extension 182) as well as the lateral extension of the further device region 176 (i.e. the extension 184) can have values of 5 μm for the emitter region 130 and the further device region 176, and 1 μm for the base region 122.

What is claimed is

1. A high-frequency switching device comprising:
   a connecting region having a first conductivity type;
   a first barrier region bordering on the connecting region, the first barrier region having a second conductivity type which differs from the first conductivity type;
   a semiconductor region bordering on the first barrier region, the semiconductor region having a dopant concentration which is lower than a dopant concentration of the first barrier region or equal to 0;
   a second barrier region bordering on the semiconductor region, the second barrier region having the first conductivity type;
   a base region bordering on the second barrier region, the base region having the second conductivity type;
   a third barrier region bordering on the semiconductor region, the third barrier region having the second conductivity type and a higher dopant concentration than the semiconductor region;
   an emitter region bordering on the third barrier region, the emitter region having the first conductivity type;
   a fourth barrier region bordering on the semiconductor region, the fourth barrier region having the second conductivity type and a higher dopant concentration than the semiconductor region; and
   a collector region bordering on the fourth barrier region, the collector region having the first conductivity type.

2. The high-frequency switching device of claim 1 wherein the second barrier region is disposed between the third barrier region and the fourth barrier region.

3. The high-frequency switching device of claim 2 wherein the connecting region is disposed at a first distance from the emitter region, and wherein the base region is disposed at a second distance from the collector region, wherein the second distance is about twice the first distance.

4. The high-frequency switching device of claim 3 wherein the second distance is equal to twice the first distance within a tolerance of plus or minus ten percent of the first distance.

5. A high-frequency circuit comprising:
   a switch with a high-frequency switching device, the high frequency switching device comprising,
      a connecting region having a first conductivity type;
      a first barrier region bordering on the connecting region, the first barrier region having a second conductivity type which differs from the first conductivity type;
      a semiconductor region bordering on the first barrier region;
      a second barrier region bordering on the semiconductor region, the second barrier region having the first conductivity type;
      a base region bordering on the second barrier region, the base region having the second conductivity type;
      a third barrier region bordering on the semiconductor region, the third barrier region having the second conductivity type;
      an emitter region bordering on the third barrier region, the emitter region having the first conductivity type;
      a fourth barrier region bordering on the semiconductor region, the fourth barrier region having the second conductivity type; and
      a collector region bordering on the fourth barrier region, the collector region having the first conductivity type; and
   a control circuit configured to open and close the switch in dependence on a control signal, wherein the controller is formed to apply a negative switching voltage between the base region and the emitter region for closing the switch.

6. The high-frequency circuit of claim 5 wherein the high-frequency circuit is configured to couple an input of the switch to a high-frequency source, wherein the high-frequency switch is configured to provide a voltage signal from the high-frequency source, the voltage signal having a high-frequency voltage amplitude, and wherein the switching voltage is less than or equal to half the high-frequency voltage amplitude.

* * * * *